(12) United States Patent
Wakita et al.

(10) Patent No.: US 8,569,415 B2
(45) Date of Patent: Oct. 29, 2013

(54) GRAFT COPOLYMER, THERMOPLASTIC RESIN COMPOSITION AND MOLDED PRODUCT

(75) Inventors: Tsuneki Wakita, Hiroshima (JP); Toshihiro Kasai, Hiroshima (JP); Masaki Maeda, Tokyo (JP); Yasunobu Kaneko, Tokyo (JP)

(73) Assignees: Mitsubishi Rayon Co., Ltd., Tokyo (JP); Techno Polymer Co., Ltd., Tokyo (JP)

( * ) Notice: Subject to any disclaimer, the term of this patent is extended or adjusted under 35 U.S.C. 154(b) by 688 days.

(21) Appl. No.: 12/668,204

(22) PCT Filed: Jul. 10, 2008

(86) PCT No.: PCT/JP2008/062487
§ 371 (c)(1), (2), (4) Date: Mar. 16, 2010

(87) PCT Pub. No.: WO2009/011280
PCT Pub. Date: Jan. 22, 2009

(65) Prior Publication Data
US 2010/0187965 A1    Jul. 29, 2010

(30) Foreign Application Priority Data
Jul. 13, 2007    (JP) ................................. 2007-184417

(51) Int. Cl.
*C08L 51/08*    (2006.01)

(52) U.S. Cl.
USPC ............................................. 525/63; 525/69

(58) Field of Classification Search
USPC .................................................... 525/63, 69
See application file for complete search history.

(56) References Cited

U.S. PATENT DOCUMENTS

| | | |
|---|---|---|
| 4,918,132 A | 4/1990 | Hongo et al. |
| 4,994,523 A | 2/1991 | Sasaki et al. |
| 5,543,460 A | 8/1996 | Yamamoto et al. |
| 5,872,184 A | 2/1999 | Mori et al. |
| 6,630,524 B1 | 10/2003 | Lim et al. |
| 2004/0249069 A1 | 12/2004 | Nakai et al. |
| 2005/0234199 A1* | 10/2005 | Taniguchi et al. ............ 525/242 |

FOREIGN PATENT DOCUMENTS

| | | |
|---|---|---|
| EP | 0 468 462 A2 | 1/1992 |
| EP | 0 468 462 A3 | 1/1992 |
| EP | 1 069 154 A1 | 1/2001 |
| EP | 1 445 281 A1 | 8/2004 |
| JP | 9 194681 | 7/1997 |
| JP | 2003 128868 | 5/2003 |
| JP | 2004 346189 | 12/2004 |
| JP | 2005 314461 | 11/2005 |
| JP | 2006 28393 | 2/2006 |
| JP | 2006 111764 | 4/2006 |

OTHER PUBLICATIONS

Extended European Search Report issued Aug. 26, 2010, in European Patent Application No. 08791045.1.

* cited by examiner

*Primary Examiner* — Jeffrey Mullis
(74) *Attorney, Agent, or Firm* — Oblon, Spivak, McClelland, Maier & Neustadt, L.L.P.

(57) ABSTRACT

There is provided a resin which, in spite of having excellent impact resistance because of containing a rubber ingredient, can be molded into a haze-free and beautiful state across the entire surface of molded products even if the molded products are large-sized injection molded products, and is suitable for molded products on which a vapor deposition layer is formed by the direct vapor deposition method, and is suitable for molded products which are joined by the hot plate welding method, particularly molded products such as housing members of automotive lamps, which require weatherability. Also provided is a graft copolymer (B) obtained by polymerizing a (meth)acrylate monomer (b1) a homopolymer of which has a glass transition temperature exceeding 0° C. in the presence of a composite rubber (A) containing a polyorganosiloxane (A1) and a poly(meth)acrylate (A2), and then polymerizing an aromatic vinyl monomer (b2) and a cyanided vinyl monomer (b3).

16 Claims, No Drawings

US 8,569,415 B2

GRAFT COPOLYMER, THERMOPLASTIC RESIN COMPOSITION AND MOLDED PRODUCT

TECHNICAL FIELD

The present invention relates to a graft copolymer obtained by polymerizing a specified monomer in the presence of a composite rubber containing a polyorganosiloxane and a poly(meth)acrylate, and a thermoplastic resin composition and a molded product using the graft copolymer, and particularly, to a graft copolymer suitable for molded products on a surface of which a vapor deposition layer is formed by direct vapor deposition, and for molded products used for hot plate welding, and a thermoplastic resin composition and a molded product using the graft copolymer.

BACKGROUND ART

A metal layer having a thickness of several tens of nanometers to several hundreds of nanometers, such as aluminum or chromium, is sometimes provided on the surface of thermoplastic resin molded products such as automotive parts and electric device housings by the vacuum deposition method, the sputtering method or the like in order to enhance the designability and functionability.

In recent years, a method of directly vapor-depositing a metal on the surface of a thermoplastic resin molded product without providing an undercoat layer, the so-called "direct vapor deposition method", has been employed in order to simplify processes. Since the designability of a molded product on which a vapor deposition layer is deposited by the direct vapor deposition method varies depending on the kind of a resin material of and the surface condition of the molded product on which a vapor deposition layer is deposited, it is important that the molded product surface before the vapor deposition layer is deposited has no haze and a beautiful bright appearance. Particularly in molded products in which a rubber is blended, a decrease in glossiness, and haze often occur.

In the case where a large-sized molded product is injection-molded, when a resin is injected into a die from a nozzle, there is a difference in molding rates of the resin in the die between the vicinity of the nozzle and the vicinity of the terminal depending on the conditions. In order to uniformize the appearance such as glossiness of a large-sized molded product, it is essential that there is no difference in the surface state of an obtained molded product across the entire surface of the molded product, specifically, across the vicinity of the nozzle to the vicinity of the terminal of the die. Hence, for molding a large-sized molded product, a thermoplastic resin composition is demanded which has a low dependency on the molding rate, that is, a small variation in the surface state even if the molding rate is varied.

Tail lamps, stop lamps, head lamps and the like for automobiles are so configured that a lens member composed of a transparent resin such as a polymethyl methacrylate (PMMA) or a polycarbonate (PC), which refracts light from a bulb as a light emission body, and a housing member supporting the lens member accommodate the bulb. For joining the lens member and the housing member, the hot plate welding method is often used because the method does not use an adhesive, and has only a small number of processes and is simple. The hot plate welding method involves pressing a fluororesin-processed, metal-made or another hot plate on each portion to be joined of thermoplastic resin molded products for several seconds to make a melted state, and thereafter quickly separating the hot plate and joining the both. In the hot plate welding method, when the hot plate pressed on a molded product is separated, parts of a melted resin fuses on the hot plate and the so-called stringing occurs in some cases. In adopting the hot plate welding method, in order to make the appearance of a joining portion beautiful, little stringing is very important.

As resin compositions for molded products causing little of such stringing and suitable for the hot plate welding method, reported are a resin composition containing a graft copolymer obtained using a composite rubber composed of a polyorganosiloxane and a poly(meth)acrylate, a resin composition containing a graft copolymer obtained using a dienic rubber, and other resin compositions (Patent Documents 1 to 5).

However, vapor deposition layers formed by the direct vapor deposition method are demanded to exhibit a further brightness. Joining portions by the hot plate welding method are requested to exhibit a more beautiful appearance. Further, housing members of automotive lamps are requested to have weatherability of a high level; and use of a resin composition containing a graft copolymer obtained using a dienic rubber does not provide a sufficient weatherability in some cases.

Patent Document 1: Japanese Patent Laid-Open No. 2006-028393
Patent Document 2: Japanese Patent Laid-Open No. 2005-314461
Patent Document 3: Japanese Patent Laid-Open No. 2003-128868
Patent Document 4: Japanese Patent Laid-Open No. 2006-111764
Patent Document 5: Japanese Patent Laid-Open No. 09-194681

DISCLOSURE OF THE INVENTION

Problems to be Solved by the Invention

It is an object of the present invention to provide a graft copolymer which, in spite of having excellent impact resistance because of containing a rubber ingredient, has a low dependency on the molding rate, can provide molded products haze-free and beautiful across the entire surface, particularly even if the molded products are large-sized injection molded products, can provide molded products on a surface of which a beautiful vapor deposition layer can be formed by the direct vapor deposition method and can provide molded products from which little-stringy, beautiful joining portions can be formed in hot plate welding, particularly can provide molded products such as housing members of automotive lamps, which require weatherability; and to provide a thermoplastic resin composition and a molded product using the graft copolymer.

Means for Solving the Problems

As a result of exhaustive studies on the above-mentioned problems, the present inventors have found a graft copolymer which, in spite of containing a rubber ingredient, has a low dependency on the molding rate, can be molded to a haze-free, beautiful state across the entire surface of molded products even in large-sized injection molding, and can provide molded products excellent in peelability from a hot plate in hot plate welding and capable of providing a stringing-suppressed, beautiful joining portion. These findings have led to the completion of the present invention.

That is, the present invention relates to a graft copolymer (B) obtained by polymerizing a (meth)acrylate monomer (a homopolymer of which has a glass transition temperature exceeding 0° C.) (b1) in the presence of a composite rubber (A) containing a polyorganosiloxane (A1) and a poly(meth)acrylate (A2), and then polymerizing an aromatic vinyl monomer (b2) and a cyanided vinyl monomer (b3).

Further, the present invention relates to a thermoplastic resin composition containing 1 to 99% by mass of the graft copolymer (B) and 99 to 1% by mass of a thermoplastic resin (C).

Additionally, the present invention relates to a molded product obtained using the thermoplastic resin composition.

Advantages of the Invention

The graft copolymer according to the present invention, in spite of having excellent impact resistance because of containing a rubber ingredient, has a low dependency on the molding rate, can provide molded products haze-free and beautiful across the entire surface, particularly even if the molded products are large-sized injection molded products, and can provide molded products on a surface of which a beautiful vapor deposition layer can be formed by the direct vapor deposition method. The graft copolymer can further provide molded products from which little-stringy, beautiful joining portions can be formed in hot plate welding, and can provide molded products having weatherability, such as housing members of automotive lamps.

The thermoplastic resin composition according to the present invention can provide molded products having a surface on which a beautiful vapor deposition layer can be formed by the direct vapor deposition method, and is suitable particularly for large-sized injection molded products. Further, the thermoplastic resin composition can provide molded products from which little-stringy, beautiful joining portions can be formed in hot plate welding, and is suitable for molded products having weatherability, such as housing members of automotive lamps.

The molded product according to the present invention has a surface on which a beautiful vapor deposition layer can be formed by the direct vapor deposition method, can form little-stringy, beautiful joining portions in hot plate welding, and is suitable as molded products having weatherability, such as housing members of automotive lamps.

BEST MODE FOR CARRYING OUT THE INVENTION

The graft copolymer according to the present invention is obtained by polymerizing a (meth)acrylate monomer (a homopolymer of which has a glass transition temperature exceeding 0° C.) (b1) in the presence of a composite rubber (A) containing a polyorganosiloxane (A1) and a poly(meth)acrylate (A2), and then polymerizing an aromatic vinyl monomer (b2) and a cyanided vinyl monomer (b3).

The composite rubber (A) used for the graft copolymer according to the present invention contains a polyorganosiloxane (A1) and a poly(meth)acrylate (A2), and is obtained by polymerization of a (meth)acrylate monomer mixture in the presence of a polyorganosiloxane (A1), or by polymerization of an organosiloxane mixture in the presence of a poly(meth)acrylate (A2).

Among these, preferable is a method in which a (meth)acrylate monomer mixture is polymerized in the presence of a polyorganosiloxane (A1), because a composite rubber (A) can stably be manufactured.

The polyorganosiloxane (A1) is preferably one in which cyclic organosiloxanes are linked through a graft crossing agent. Such a polyorganosiloxane (A1) is preferably obtained by emulsion polymerizing an organosiloxane mixture containing an organosiloxane (a1) and a graft crossing agent for polyorganosiloxane (hereinafter, referred to as "siloxane crossing agent") and as required, a crosslinking agent for polyorganosiloxane (hereinafter, referred to as "siloxane crosslinking agent").

The organosiloxane (a1) is preferably a three- or more membered cyclic organosiloxane, and more preferably a three- to six-membered one. Cyclic organosiloxanes include, for example, hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane or octaphenylcyclotetrasiloxane. These may be used singly or in combination of two or more.

The siloxane crossing agent is preferably one which can bond with the organosiloxane (a1) through a siloxane bond, and can form bonds with a poly(meth)acrylate (A2) in a composite rubber (A), a (meth)acrylate monomer (31) and the like. Alkoxysilane compounds having a vinyl group are preferable in order to enhance the reactivity with an organosiloxane.

The siloxane crossing agent includes, for example, methacryloyloxysilanes such as β-methacryloyloxyethyldimethoxymethylsilane, γ-methacryloyloxypropyldimethoxymethylsilane, γ-methacryloyloxypropylmethoxydimethylsilane, γ-methacryloyloxypropyltrimethoxysilane, γ-methacryloyloxypropylethoxydiethylsilane, γ-methacryloyloxypropyldiethoxymethylsilane or δ-methacryloyloxybutyldiethoxymethylsilane; vinylsiloxanes such as tetramethyltetravinylcyclotetrasiloxane; vinylphenylsilanes such as p-vinylphenyldimethoxymethylsilane; or mercaptosilanes such as γ-mercaptopropyldimethoxymethylsilane or γ-mercaptopropyltrimethoxysilane. These may be used singly or in combination of two or more.

The siloxane crosslinking agent is preferably one having three or four functional groups bondable with the organosiloxane (a1).

The siloxane crosslinking agent includes, for example, trialkoxyalkylsilanes such as trimethoxymethylsilane; trialkoxyarylsilanes such as triethoxyphenylsilane; or tetraalkoxysilanes such as tetramethoxysilane, tetraethoxysilane, tetra-n-propoxysilane or tetrabutoxysilane. These may be used singly or in combination of two or more. Among these, a tetraalkoxysilane is preferable and tetraethoxysilane is more preferable.

With respect to the ratio of the use amounts of the organosiloxane (a1), the siloxane crossing agent and the siloxane crosslinking agent, if these three ingredients are defined as an organosiloxane mixture, the organosiloxane (a1) is preferably in the range of 60 to 99.9% by mass, and more preferably in the range of 70 to 99.9% by mass, in 100% by mass of the organosiloxane mixture. The siloxane crossing agent is preferably in the range of 0.1 to 10% by mass; and the siloxane crosslinking agent is preferably in the range of 0 to 30% by mass.

The emulsion polymerization of the organosiloxane mixture can be carried out by the following methods. They are a method in which an emulsifier and water are added to an organosiloxane mixture to obtain a latex, and the latex is microparticulated and thereafter mixed with an acid catalyst to be reacted, a method in which an emulsifier and water and together an acid catalyst are added to an organosiloxane mixture to make a latex, and the latex is microparticulated to be reacted, or other methods.

Emulsifiers to be used include, for example, anionic emulsifiers such as sodium alkylbenzenesulfonates, sodium alkylsulfonates or sodium polyoxyethylene alkylsulfates. These may be used singly or in combination of two or more. Among these, preferable are sulfonate emulsifiers such as sodium alkylbenzenesulfonates or sodium laurylsulfonate.

The use amount of an emulsifier is preferably 0.05 parts by mass or more with respect to 100 parts by mass of an organosiloxane mixture in order to hold a stable dispersion state of a latex. Further, the use amount thereof is preferably 15 parts by mass or less with respect to 100 parts by mass of an organosiloxane mixture in order to avoid influences of the coloration caused by the emulsifier itself and the coloration due to the deterioration of a thermoplastic resin composition.

Microparticulation of a latex can involve use of a Homo Mixer, which microparticulates a hydrophobic substance in a latex by a shear force by a high-speed rotation, a homogenizer which microparticulates by a jetting force by a high-pressure generator, or the like. Use of a high-pressure emulsification apparatus such as a homogenizer can provide a latex of an organosiloxane mixture having a narrow particle diameter distribution width, which is preferable.

Mixing of an acid catalyst in the case of mixing it before the microparticulation of a latex may involve a mixing method in which the acid catalyst as an aqueous solution or a solid thereof as it is added to an organosiloxane mixture, an emulsifier and water, and is mixed. For mixing in the case of mixing an acid catalyst with a latex after the microparticulation, there is a method in which the acid catalyst is made into an aqueous solution, and a microparticulated latex is dropwise added to the high-temperature acid aqueous solution at a constant rate while the polymerization reaction are being progressed, which is preferable because the particle diameter of an obtained polyorganosiloxane is easily controlled.

The acid catalyst includes, for example, sulfonic acids such as aliphatic sulfonic acids, aliphatic-substituted benzenesulfonic acids or aliphatic-substituted naphthalenesulfonic acids; or mineral acids such as sulfuric acid, hydrochloric acid or nitric acid. These may be used singly or in combination of two or more. Among these, aliphatic-substituted benzenesulfonic acids are preferable because of its excellent stabilization action of a latex of polyorganosiloxane, and n-dodecylbenzenesulfonic acid is more preferable.

The use amount of an acid catalyst is preferably in the range of 0.1 to 15 parts by mass with respect to 100 parts by mass of an organosiloxane mixture.

The polymerization time in a method in which a latex after the microparticulation is dropped in a high-temperature acid aqueous solution at a constant rate, is preferably approximately 1 hour after the completion of the dropping of the latex. The polymerization reaction in a method in which a latex is microparticulated after the addition of an acid catalyst, is preferably carried out for 2 or more hours, and more preferably 5 or more hours. The polymerization temperature is preferably 50° C. or higher, and more preferably 80° C. or higher.

The termination of the polymerization is carried out by cooling a reaction liquid, and further neutralizing the liquid with an alkaline substance such as sodium hydroxide, potassium hydroxide or sodium carbonate.

The size of an obtained polyorganosiloxane particle is preferably a mass-average particle diameter of 100 nm or less, and more preferably 80 nm or less, in order to enhance the brightness of molded products after the direct vapor deposition.

A poly(meth)acrylate (A2) is preferably obtained by polymerizing a (meth)acrylate monomer mixture containing a (meth)acrylate monomer (a2), a graft crossing agent for poly(meth)acrylate (hereinafter, referred to as "acryl crossing agent"), and as required, a crosslinking agent for poly(meth)acrylate (hereinafter, referred to as "acryl crosslinking agent") in the presence of the polyorganosiloxane (A1).

Here, (meth)acryl indicates acryl or methacryl; and (meth)acrylate means acrylate or methacrylate.

The (meth)acrylate monomer (a2) includes, for example, alkyl acrylates such as methyl acrylate, ethyl acrylate, n-propyl acrylate, n-butyl acrylate or 2-ethylhexyl acrylate; or alkyl methacrylates such as hexyl methacrylate, 2-ethylhexyl methacrylate, dodecyl methacrylate or tridecyl methacrylate. These may be used singly or in combination of two or more. Among these, preferable are n-butyl acrylate or 2-ethylhexyl acrylate.

The acryl crossing agent preferably has two or more unsaturated groups capable of bonding with the (meth)acrylate monomer (a2), between which unsaturated groups the reactivity with the (meth)acrylate monomer (a2) is different. Having such unsaturated groups having different reactivity causes an acryl crossing agent bonded with a poly(meth)acrylate (A2) to preserve an unsaturated group, allowing for bonding with a vinyl monomer (b) in a post-process to form a graft copolymer (B).

Such an acryl crossing agent includes, for example, allyl methacrylate, triallyl cyanurate or triallyl isocyanurate. These may be used singly or in combination of two or more.

Allyl methacrylate has a methacryl group having a high reactivity and an allyl group having a lower reactivity than that of the methacryl group, and functions as a crosslinking agent by which the methacryl group and also part of the allyl group are polymerized in the polymerization process of a (meth)acrylate monomer. However, not all of the allyl group takes part in the polymerization reaction, and part thereof is preserved in the poly(meth)acrylate (A2). The allyl group in the poly(meth)acrylate (A2) acts as a graft polymerization starting point in a later polymerization process of a vinyl monomer (b) to form a graft copolymer (B).

In triallyl cyanurate and triallyl isocyanurate, if one allyl group of three allyl groups polymerizes in the polymerization procedure of a (meth)acrylate monomer, the other two allyl groups become different in reactivity, and are preserved in the poly(meth)acrylate (A2). The allyl groups in the poly(meth)acrylate (A2) acts as graft polymerization starting points in the subsequent polymerization process of a vinyl monomer (b) to form a graft copolymer (B).

The acryl crosslinking agent preferably has two or more functional groups bondable with the (meth)acrylate monomer (a2), and forms crosslinks in a poly(meth)acrylate (A2).

The acryl crosslinking agent includes, for example, ethylene glycol di(meth)acrylate, diethylene glycol di(meth)acrylate, triethylene glycol di(meth)acrylate, tetraethylene glycol di(meth)acrylate, polyethylene glycol di(meth)acrylate, neopentyl glycol di(meth)acrylate, butanediol di(meth)acrylate, hexanediol di(meth)acrylate, trimethylolpropane tri(meth)acrylate, tetramethylol tetra(meth)acrylate or divinylbenzene. These may be used singly or in combination of two or more.

With respect to the ratio of the use amounts of the (meth)acrylate monomer (a2), the acryl crossing agent and the acryl crosslinking agent, if these three ingredients are defined as a (meth)acrylate monomer mixture, the (meth)acrylate monomer (a2) is preferably in the range of 80 to 99.99% by mass, and more preferably in the range of 90 to 99.99% by mass, in 100% by mass of the (meth)acrylate monomer mixture; the acryl crossing agent is preferably in the range of 0.01 to 10% by mass; and the acryl crosslinking agent is preferably in the range of 0 to 10% by mass.

If the ratio of the use amount of the acryl crossing agent is 0.01% by mass or more in 100% by mass of the (meth) acrylate monomer mixture, the poly(meth)acrylate (A2) becomes one having a sufficient graft polymerization starting point; and if that is 10% by mass or less, the poly(meth) acrylate (A2) can maintain the rubber elasticity.

If the ratio of the use amount of the acryl crosslinking agent is 10% by mass or less in 100% by mass of the (meth)acrylate monomer mixture, the poly(meth)acrylate (A2) can maintain the rubber elasticity.

The polymerization of the (meth)acrylate monomer mixture can be carried out by the following method. The (meth) acrylate monomer mixture is added to the polyorganosiloxane (A1) latex and polymerized. The addition of the (meth) acrylate monomer mixture to the polyorganosiloxane (A1) latex may be carried out at one time or dividedly, or by continuous dropping. In the polymerization of a (meth)acrylate monomer mixture, as required, water, an emulsifier, a radical polymerization initiator, a chain transfer agent and the like are added for the emulsion polymerization. An emulsifier and water are added to a (meth)acrylate monomer mixture to obtain a latex, and the latex is microparticulated by the same method as described above, and may be added to a polyorganosiloxane (A1) latex.

The radical polymerization initiator includes, for example, peroxosulfates, organic peroxides, azo compounds, redox initiators in combinations of the peroxosulfate and a reducing agent, or redox initiators in combinations of the organic peroxide and a reducing agent. Among these, preferable are redox initiators, and especially preferable are redox initiators in combinations of ferrous sulfate, sodium pyrophosphate, glucose and hydroperoxide, or of ferrous sulfate, disodium ethylenediaminetetraacetate, Rongalit and hydroperoxide.

The chain transfer agent includes, for example, mercaptan compounds, terpene compounds or α-methylstyrene dimmer.

The emulsifier includes, for example, various types of carboxylates such as sodium sarcosinate, fatty acid potassium salts, fatty acid sodium salts, dipotassium alkenylsuccinate or rosin acid soaps; or anionic emulsifiers such as alkylsulfates, sodium alkylbenzenesulfonates, sodium alkylsulfonates or sodium polyoxyethylene alkylsulfates. These stably hold a latex during emulsion polymerization, and can raise the degree of polymerization, and may be used singly or in combination of two or more. These emulsifiers may be replaced by emulsifiers used in the polymerization of the polyorganosiloxane (A1).

An organosiloxane mixture is preferably used in the range of 1 to 20% by mass, and more preferably in the range of 5 to 10% by mass, with respect to 100% by mass of the total of an organosiloxane mixture and a (meth)acrylate monomer mixture used for manufacture of a composite rubber (A).

A (meth)acrylate monomer mixture is preferably used in the range of 80 to 99% by mass, and more preferably in the range of 90 to 95% by mass, with respect to 100% by mass of the total of an organosiloxane mixture and a (meth)acrylate monomer mixture used for manufacture of a composite rubber (A).

The size of an obtained composite rubber (A) preferably has a mass-average particle diameter of 140 nm or less, and more preferably 105 nm or less, in order to enhance the brightness of molded products after the direct vapor deposition.

The composite rubber (A) according to the present invention preferably contains a solid content contained in a latex obtained by polymerizing a (meth)acrylate monomer mixture in the presence of a polyorganosiloxane (A1).

The latex contains, along with the progress of polymerization of a (meth)acrylate monomer mixture, a graft copolymer produced by graft polymerizing a poly(meth)acrylate (A2) to a polyorganosiloxane (A1), and further a graft copolymer in which a crosslinking network mutually entangled at the interface between the polyorganosiloxane (A1) and the poly (meth)acrylate (A2) is formed and the both cannot substantially be separated from each other, due to the presence of a siloxane crossing agent, and additionally contains the poly (meth)acrylate (A2) which does not form a graft copolymer with the polyorganosiloxane (A1) and is present as a homopolymer or a copolymer.

In order to obtain the graft copolymer (B) according to the present invention, three types of vinyl monomers (b) of a (meth)acrylate monomer (b1), an aromatic vinyl monomer (b2) and a cyanided vinyl monomer (b3) are used.

The (meth)acrylate monomer (b1) has a glass transition temperature (hereinafter, referred to as "Tg") as a homopolymer thereof exceeding 0° C. Since the (meth)acrylate monomer (b1) has a low compatibility with a composite rubber (A), and is polymerized with the composite rubber (A) preceding the polymerization with the aromatic vinyl monomer (b2) and the cyanided vinyl monomer (b3), the (meth)acrylate monomer (b1) has a function of suppressing the impregnation of the aromatic vinyl monomer (b2) and the cyanided vinyl monomer (b3) in the composite rubber (A).

The (meth)acrylate monomer (b1) includes, for example, alkyl methacrylates such as methyl methacrylate (Tg: 105° C.), ethyl methacrylate (Tg: 65° C.), n-butyl methacrylate (Tg: 20° C.) or i-butyl methacrylate (Tg: 60° C.); and alkyl acrylates such as methyl acrylate (Tg: 10° C.). These may be used singly or in combination of two or more.

Tgs of the above-mentioned homopolymers can employ numerical values described in POLYMER HANDBOOK THIRD EDITION (WILEY INTERSCIENCE).

The aromatic vinyl monomer (b2) is used to improve the compatibility of the graft copolymer (B) with a matrix resin. The aromatic vinyl monomer (b2) includes, for example, styrene, α-methylstyrene or vinyltoluene. These may be used singly or in combination of two or more. Among these, styrene is preferable.

The cyanided vinyl monomer (b3) is used to improve the compatibility of the graft copolymer (B) with a matrix resin. The cyanided vinyl monomer (b3) includes, for example, acrylonitrile or methacrylonitrile. These may be used singly or in combination of two or more. Among these, acrylonitrile is preferable.

With respect to the ratio of the use amounts of the (meth) acrylate monomer (b1), the aromatic vinyl monomer (b2) and the cyanided vinyl monomer (b3), the (meth)acrylate monomer (b1) is preferably in the range of 40 to 60% by mass with respect to 100% by mass of the total of these three vinyl monomers (b).

If the ratio of the use amount of the (meth)acrylate monomer (b1) is 40% by mass or more in 100% by mass of the total of three vinyl monomers (b), the stringing in hot plate welding of molded products can be suppressed; and if that is 60% by mass or less, a direct vapor deposition layer excellent in brightness can be formed on molded products.

The ratio by mass (b3/b2) of the use amounts of the aromatic vinyl monomer (b2) and the cyanided vinyl monomer (b3) is preferably in the range of 0.2 to 0.5. With (b3/b2) of 0.2 or more, the stringing in hot plate welding of molded products can be suppressed and joining portions excellent in the appearance can be formed. With (b3/b2) of 0.5 or less, the graft polymerization reaction can easily be carried out.

The composite rubber (A) is preferably used in the range of 30 to 90% by mass, more preferably in the range of 50 to 85% by mass, and especially preferably in the range of 70 to 80% by mass, with respect to 100% by mass of the total of the composite rubber (A) and the vinyl monomers (b) used for manufacture of a graft copolymer (B).

If 30% by mass or more of the composite rubber (A) is used with respect to 100% by mass of the total of the composite rubber (A) and the vinyl monomers (b), the stringing in hot plate welding of molded products can be suppressed and joining portions excellent in the appearance can be obtained; and use of 90% by mass or less thereof can form a direct vapor deposition layer excellent in the brightness on molded products.

The vinyl monomers (b) are used preferably in the range of 10 to 70% by mass, more preferably in the range of 15 to 50% by mass, and especially preferably in the range of 20 to 30% by mass, with respect to 100% by mass of the total of the composite rubber (A) and the vinyl monomers (b) used for manufacture of a graft copolymer (B).

If 10% by mass or more of the vinyl monomers (b) is used with respect to 100% by mass of the total of the composite rubber (A) and the vinyl monomers (b), a direct vapor deposition layer excellent in the brightness can be formed on molded products; and use of 70% by mass or less can suppress the stringing in hot plate welding of molded products and joining portions excellent in the appearance can be obtained.

In order to obtain the graft copolymer (B) according to the present invention, among these vinyl monomers, a (meth) acrylate monomer (b1) is first polymerized in the presence of a composite rubber (A). The composite rubber (A) to be preferably used is a latex as a reaction system containing a poly(meth)acrylate (A2) obtained by emulsion polymerizing a (meth)acrylate monomer mixture in the presence of a polyorganosiloxane (A1).

The polymerization of a (meth)acrylate monomer (b1) is preferably carried out by adding the (meth)acrylate monomer (b1) to a composite rubber (A) latex. The emulsion polymerization of the (meth)acrylate monomer (b1) may be carried out, as required, by adding water, an emulsifier, a radical polymerization initiator, a chain transfer agent and the like. Other monomers may be concurrently used in the range of not damaging properties of the (meth)acrylate monomer (b1).

The emulsifier, the radical polymerization initiator, the chain transfer agent and the like include the same as those exemplified for use in the polymerization of the poly(meth) acrylate (A2).

In a latex obtained by polymerization of a (meth)acrylate monomer (b1), a graft copolymer obtained by graft polymerizing a poly(meth)acrylate (B1) to a composite rubber (A) is produced.

The polymerization of an aromatic vinyl monomer (b2) and a cyanided vinyl monomer (b3) that is carried out thereafter is preferably carried out by adding these monomers to the latex containing the graft copolymer of the poly(meth) acrylate (B1). The polymerization of these monomers may involve emulsion polymerization, as required, by adding water, an emulsifier, a radical polymerization initiator, a chain transfer agent and the like. Other monomers may be concurrently used in the range of not damaging properties of the aromatic vinyl monomer (b2) and the cyanided vinyl monomer (b3).

The emulsifier, the radical polymerization initiator, the chain transfer agent and the like include the same as those exemplified for use in the polymerization of the poly(meth) acrylate (A2).

As a result of the polymerization of the aromatic vinyl monomer (b2) and the cyanided vinyl monomer (b3), a graft copolymer (B) is obtained in which the poly(meth)acrylate (B1) and an aromatic vinyl/cyanided vinyl copolymer (B2/B3) are graft polymerized to the composite rubber (A).

The mass-average particle diameter of the graft copolymer (B) according to the present invention is preferably 40 nm or more because it gives an excellent brightness appearance after the direct vapor deposition of obtained molded products. That is preferably 150 nm or less, and more preferably 110 nm or less.

The graft copolymer (B) can be obtained as a powder by drying the latex as the reaction system.

Drying methods of the latex include, for example, a method in which the latex is directly dried using a spray drier, or a method in which the latex is coagulated suitably using a coagulant including acids such as sulfuric acid, hydrochloric acid or phosphoric acid, or salts such as calcium chloride or calcium acetate, subjected to a thermal treatment to be solidified, thereafter filtered, washed and dehydrated, and recovered as a powder. The method in which the latex is directly dried using a spray drier is preferable because of the easy handling when the latex is recovered as a powder.

The spray drier is an apparatus to spray a latex in liquid droplets and expose the droplets to hot air to dry the latex droplets. An employable method of generating liquid droplets is any one of a rotary disc type, a pressure nozzle type, a two liquid nozzle type, a pressurized two liquid nozzle type or the like. The capacity of a spray drier is not especially limited, and usable is any of ones having a small scale such as used in laboratories through a large scale such as used in industries. The maximum temperature of hot air (hot air inlet temperature) introduced in the drier is preferably 200° C. or lower, and more preferably in the range of 120 to 180° C.

A powder of a graft copolymer (B) containing desired substances can be obtained by mixing a latex containing desired additives such as an antioxidant with a latex of a graft copolymer (B), and spraying and drying the mixture, or by spraying and drying the latexes at the same time without mixing them. In order to improve powder properties such as blocking and bulk specific gravity in spraying and drying, spraying and drying may be carried out by additionally adding inorganic fillers such as silica, talc or calcium carbonate, or polyacrylate, polyvinyl alcohol, polyacrylamide or the like.

The graft copolymer (B) obtained as a powder contains, in addition to a graft copolymer in which vinyl monomers (b) are graft polymerized to a composite rubber (A) contained in a latex as a reaction system, a poly(meth)acrylate (B1) and an aromatic vinyl/cyanided vinyl copolymer (B2/B3) which have not been grafted to the composite rubber (A). The graft copolymer (B) according to the present invention preferably contains these polymers which have not been grafted.

The thermoplastic resin composition according to the present invention is characterized by containing 1 to 99% by mass of the graft copolymer (B) and 99 to 1% by mass of a thermoplastic resin (C) (the total of (B) and (C) is 100% by mass).

The thermoplastic resins (C) preferably used for the thermoplastic resin composition according to the present invention are, for example, polymethyl methacrylates, polycarbonate resins, polybutylene terephthalates (PBT resins), polyethylene terephthalates (PET resins), polyethylene naphthalates (PEN resins), polyvinyl chlorides, polystyrenes, modified polyphenylene ethers (modified PPE resins), polyamides, acrylonitrile-styrene copolymers (AS resins), acrylonitrile-α-methylstyrene copolymers (αSAN resins), styrene-maleic anhydride copolymers, methyl methacrylate-styrene copolymers (MS resins), acrylonitrile-styrene-N-substituted maleimide ternary copolymers, styrene-maleic anhydride-N-substituted maleimide ternary copolymers or acrylonitrile-styrene-methyl methacrylate copolymers.

In addition, utilizable are polyolefins such as polyethylenes or polypropylenes; styrenic elastomers such as styrene-butadiene-styrene (SBS), styrene-butadiene (SBR), hydrogenated SBS or styrene-isoprene-styrene (SIS); various types of olefinic elastomers, various types of polyester elastomers, polyacetal resins, ethylene-vinyl acetate copolymers, PPS resins, PES resins, PEEK resins, polyarylates or liquid crystal polyester resins.

The graft copolymer (B) contained in the thermoplastic resin composition according to the present invention is 1 to 99% by mass, and preferably 18 to 60% by mass. If the content of the graft copolymer (B) in the thermoplastic resin composition (100% by mass) is 1% by mass or more, the stringing in hot plate welding of obtained molded products can be suppressed; and if that is 99% by mass or less, a vapor deposition layer excellent in brightness can be formed on obtained molded products by the direct vapor deposition.

To the thermoplastic resin composition according to the present invention, as required, additives may be blended such as a stabilizer, a reinforcing agent, a filler, a flame retardant, a foaming agent, a lubricant, a plasticizer, an antistatic agent, a weather resistive agent, a UV absorbent or the like, which are well-known, in the range of not damaging functions of the above-mentioned contained ingredients.

Manufacture methods of the thermoplastic resin composition according to the present invention include, for example, a method in which a graft copolymer (B), a thermoplastic resin (C), and additives added according to need are mixed and dispersed by a V-type blender, a Henschel mixer or the like to make a mixture, and the mixture is melted and kneaded using an extruder, or a kneading machine such as a Banbury mixer, a pressure kneader or a roll.

The thermoplastic resin composition according to the present invention is preferably a thermoplastic resin composition for molded products on a surface of which a vapor deposition layer is formed by the direct vapor deposition. The direct vapor deposition method is a method of forming a vapor deposition layer of a metal or the like directly on the surface of molded products by the vacuum deposition method, the sputtering method or the like without providing an undercoat layer. The direct vapor deposition method specifically includes a method in which a molded product molded using the thermoplastic resin composition according to the present invention is set in a vessel which is depressurized to about $10^{-3}$ to $10^{-4}$ Pa, and a vapor deposition material mounted on a position apart from the molded product is heated and vaporized or sublimed to be adhered on the surface of the molded product to form a vapor deposition layer. The heating method can suitably be selected and employed from well-known methods such as resistance heating or high frequency induction, depending on the vapor deposition material and the kind of the molded product. The vapor deposition material usable is a metal such as aluminum, chromium, zinc, gold, silver, platinum or nickel, and additionally, a metal oxide. The molded product may be subjected to a treatment with RF plasma or ion gun irradiation to improve the adhesivity before the vapor deposition.

Further, the thermoplastic resin composition according to the present invention is preferably a thermoplastic resin composition for molded products used for hot plate welding. The hot plate welding method is a method in which a heated hot plate is pressed on each joining surface of molded products to melt the surfaces of the molded products, and the molded products are joined utilizing the molecular bond generated by mutually joining the melted portions. The method specifically includes a method in which a metal plate whose surface has been fluororesin-processed is heated at a temperature equal to or higher than the melting point of a molded product, for example, at 200 to 260° C., and pressed on each portion to be joined of molded products for 8 to 15 sec to melt the surface; the hot plate is separated from the molded product surface; and the melted portions are joined and pressed and held with a sinking margin of 0.3 to 1.5 mm for 5 to 15 sec.

The molded product according to the present invention is obtained using the thermoplastic resin composition. The employable molding methods are, for example, injection molding, extrusion, blow molding, compression molding, calender molding or inflation molding.

The molded product according to the present invention can be subjected to a metalization treatment on the surface thereof by a direct vapor deposition method such as the vacuum deposition method or the sputtering method, without any special pretreatment including formation of an undercoat-treated layer.

The bright surface of a metalized molded product may suffice as it is, but in order to protect it from generation of scratches by dusts and oxidation degradation, a film such as silicone is more preferably formed by a topcoat treatment such as coating, a plasma polymerization or the like.

The molded product according to the present invention can be used suitably in the broad fields including housing members for tail lamps, stop lamps, head lamps or the like for automobiles; electric and household appliance parts such as housing members for illumination devices or housing members for OA devices; electronic parts such as pickup lenses or LEDs; mechanical parts; house and building parts; or everyday sundries. The molded product is also suitably used for vessels of fuel tanks or the like obtained by welding and joining bi- or more partite parts, various types of hose connectors for industries, cut-off valves, fuel pump casings, inlet pipes or the like.

Tail lamps, stop lamps, head lamps or the like for automobiles are constituted mainly of a lens member composed of a transparent resin such as PMMA or PC, and a housing member supporting the lens member. Such automotive lamps are manufactured by joining a lens member and a housing member by the hot plate welding method.

The housing members of automotive lamps are desired to be composed of a resin having excellent weatherability because it is often exposed to sunlight in the open air.

In the hot plate welding method, since part of each of both materials is fused to a high-temperature hot plate and sometimes generates stringing when the hot plate is separated, little stringing is also important in using these materials. Further, it is also important to obtain a surface exhibiting a haze-free and beautiful, bright appearance.

In recent years, upsizing and complication of shapes have progressed in housing members of automotive lamps. The thermoplastic resin composition according to the present invention, which has a low dependency on the molding rate, and can provide large-sized molded products with a uniform appearance, is suitable for housing members for automotive lamps because of little stringing in the hot plate welding process.

EXAMPLES

Hereinafter, the graft copolymer (B), the thermoplastic resin composition and the molded product according to the present invention will be described specifically, but the technical scope of the present invention is not limited thereto. Hereinafter, "parts" and "%" indicate "parts by mass" and "% by mass", respectively.

[Measurement of the Mass-Average Particle Diameter]

The mass-average particle diameter of a polymer in a latex was measured employing a sample obtained by diluting the latex with distilled water, and using a particle size distribution analyzer (CHDF2000, made by MATEC Co. in USA).

The measurement conditions employed were the standard conditions which MATEC Co. recommended. The measurement specifically used a dedicated capillary-type cartridge for separation of particles, and a carrier liquid, and conditions: an approximately neutral liquid state; a flow rate of 1.4 mL/min; a pressure of about 4,000 psi; and a temperature of 35° C., and 0.1 ml of the latex diluted to a concentration of about 3%.

As the standard particle diameter substances, 12 items in total of monodispersion polystyrenes having known particle diameters, made by Duke Scientific Corp., in the range of 20 to 800 nm were used.

Manufacture Example 1

Manufacture of a Polyorganosiloxane Latex (SLx-1)

1.96 parts of γ-methacryloyloxypropyldimethoxymethylsilane and 98.04 parts of an organosiloxane were mixed to obtain 100 parts of an organosiloxane mixture.

313 parts of deionized water in which 0.68 parts of sodium dodecylbenzenesulfonate was dissolved was added to the organosiloxane mixture, stirred for 5 min at 10,000 rpm by a Homo Mixer, and thereafter twice passed through a homogenizer at a pressure of 300 kg/cm² to microparticulate an organosiloxane latex.

13 parts of dodecylbenzenesulfonic acid and 92 parts of deionized water were charged in a separable flask equipped with a thermometer, a cooling tube and a stirrer to prepare a 12.4% dodecylbenzenesulfonic acid aqueous solution. The microparticulated organosiloxane latex was dropped in the aqueous solution kept at a heated state of 85° C. in 8 hours, and after the completion of the dropping, the temperature of the resultant solution was kept for 2 hours, and cooled.

Then, the reaction product was neutralized with a sodium hydroxide aqueous solution to complete the polymerization to obtain a polyorganosiloxane latex (SLx-1). The polyorganosiloxane had a mass-average particle diameter of 60 nm.

The obtained latex was dried at 170° C. for 30 min and its solid content was determined to be 18.7%.

Manufacture Example 2

Manufacture of a Polyorganosiloxane Latex (SLx-2)

10 parts of dodecylbenzenesulfonic acid and 92 parts of deionized water were charged in a separable flask equipped with a thermometer, a cooling tube and a stirrer to prepare a 9.8% dodecylbenzenesulfonic acid aqueous solution. The microparticulated organosiloxane latex obtained as in Manufacture Example 1 was dropped in the aqueous solution kept at a heated state of 85° C. in 4 hours, and after the completion of the dropping, the temperature of the resultant solution was kept for 2 hours, and cooled.

Then, the reaction product was neutralized with a sodium hydroxide aqueous solution to complete the polymerization to obtain a polyorganosiloxane latex (SLx-2). The polyorganosiloxane had a mass-average particle diameter of 82 nm.

The obtained latex was dried at 170° C. for 30 min and its solid content was determined to be 18.7%.

Example 1

Manufacture of a Graft Copolymer (SIM-1)

28.1 parts of the polyorganosiloxane latex (SLx-1) was charged in a separable flask equipped with a thermometer, a nitrogen-introducing tube, a cooling tube and a stirrer. 206 parts of deionized water was added thereto, and thereafter a mixed liquid of 0.4 parts of sodium polyoxyethylene laurylsulfate, 67.7 parts of n-butyl acrylate, 2.1 parts of allyl methacrylate and 0.28 parts of t-butyl hydroperoxide was charged thereto, and stirred for 30 min to be impregnated in the polyorganosiloxane particles.

A nitrogen gas flow was introduced in the separable flask to replace the flask atmosphere by nitrogen, and the liquid temperature was raised to 55° C. At the time when the liquid temperature reached 55° C., an aqueous solution in which 0.0001 parts of ferrous sulfate, 0.0003 parts of disodium ethylenediaminetetraacetate and 0.3 parts of Rongalit were dissolved in 3.3 parts of deionized water was added thereto to initiate the radical polymerization. The liquid temperature rose to 92° C. due to the polymerization of the n-butyl acrylate mixed liquid. This state was kept for 1 hour to complete the polymerization of n-butyl acrylate to obtain a composite rubber latex. The obtained composite rubber had a mass-average particle diameter of 84 nm.

After the liquid temperature decreased to 75° C., a mixed liquid of 0.0625 parts of t-butyl hydroperoxide and 12.5 parts of methyl methacrylate were dropped onto the composite rubber latex in 20 min, and this state was kept for 30 min.

Thereafter, a mixed liquid of 0.0625 parts of t-butyl hydroperoxide, 9.4 parts of styrene and 3.1 parts of acrylonitrile was dropped thereto in 25 min and kept at 75° C. for 1 hour to complete the graft polymerization to the composite rubber.

The obtained graft copolymer had a mass-average particle diameter of 92 nm. The latex was dried at 170° C. for 30 min and the solid content was determined to be 29.9%.

The graft copolymer latex was dried using a spray drier by spraying the latex as fine liquid droplets by a pressure nozzle type with the temperature of a hot air inlet of 180° C. while 0.05 parts of a hydrophobic silica (R-972, made by Nippon Aerosil Co., Ltd.) with respect to 100 parts of the graft copolymer was simultaneously added from the vicinity of the hot air inlet, to obtain a powder of a graft copolymer (SIM-1).

Example 2

Manufacture of a Graft Copolymer (SIM-2)

18.7 parts of the polyorganosiloxane latex (SLx-1) was charged in a separable flask equipped with a thermometer, a nitrogen-introducing tube, a cooling tube and a stirrer. 206 parts of deionized water was added thereto, and thereafter a mixed liquid of 0.4 parts of sodium polyoxyethylene laurylsulfate, 45.1 parts of n-butyl acrylate, 1.4 parts of allyl methacrylate and 0.19 parts of t-butyl hydroperoxide was charged thereto, and stirred for 30 min to be impregnated in the polyorganosiloxane particles.

A nitrogen gas flow was introduced in the separable flask to replace the flask atmosphere by nitrogen, and the liquid temperature was raised to 60° C. At the time when the liquid temperature reached 60° C., an aqueous solution in which 0.0001 parts of ferrous sulfate, 0.0003 parts of disodium ethylenediaminetetraacetate and 0.3 parts of Rongalit were dissolved in 3.3 parts of deionized water was added thereto to initiate the radical polymerization. The liquid temperature rose to 92° C. due to the polymerization of the n-butyl acrylate mixed liquid. This state was kept for 1 hour to complete the polymerization of n-butyl acrylate to obtain a composite rubber latex. The obtained composite rubber had a mass-average particle diameter of 81 nm.

After the liquid temperature decreased to 75° C., a mixed liquid of 0.125 parts of t-butyl hydroperoxide and 25 parts of methyl methacrylate were dropped onto the composite rubber latex in 40 min, and this state was kept for 30 min.

Thereafter, a mixed liquid of 0.125 parts of t-butyl hydroperoxide, 18.8 parts of styrene and 6.2 parts of acrylonitrile was dropped thereto in 50 min, and kept at 75° C. for 1 hour to complete the graft polymerization to the composite rubber.

The obtained graft copolymer had a mass-average particle diameter of 89 nm. The latex was dried at 170° C. for 30 min and the solid content was determined to be 29.5%.

The spraying and drying was carried out as in Example 1 to obtain a powder of a graft copolymer (SIM-2).

Example 3

Manufacture of a Graft Copolymer (SIM-3)

The graft polymerization was completed as in Example 1, except for altering the twice use amounts of t-butyl hydroperoxide from 0.0625 parts to 0.03125 parts, respectively, to obtain a powder of a graft copolymer (SIM-3).

The obtained graft copolymer had a mass-average particle diameter of 95 nm. The latex was dried at 170° C. for 30 min and the solid content was determined to be 30.1%.

Example 4

Manufacture of a Graft Copolymer (SIM-4)

The graft polymerization was completed as in Example 1, except for altering the twice use amounts of t-butyl hydroperoxide from 0.0625 parts to 0.1875 parts, respectively, to obtain a powder of a graft copolymer (SIM-4).

The obtained graft copolymer had a mass-average particle diameter of 93 nm. The latex was dried at 170° C. for 30 min and the solid content was determined to be 30.0%.

Example 5

Manufacture of a Graft Copolymer (SIM-5)

A graft copolymer (SIM-5) was manufactured as in Example 1, except for altering the polyorganosiloxane latex (SLx-1) to the polyorganosiloxane latex (SLx-2).

The obtained composite rubber had a mass-average particle diameter of 112 nm, and the obtained graft copolymer had a mass-average particle diameter of 123 nm. The latex was dried at 170° C. for 30 min and the solid content was determined to be 29.5%.

Comparative Example 1

Manufacture of a Graft Copolymer (SIM-6)

A composite rubber latex was obtained as in Example 1; and after the liquid temperature decreased to 75° C., a mixed liquid of 0.5 parts of t-butyl hydroperoxide and 25.0 parts of methyl methacrylate was dropped onto the composite rubber latex in 40 min, and kept at 75° C. for 1 hour to complete the graft polymerization to the composite rubber. The spraying and drying was carried out as in Example 1 to obtain a powder of a graft copolymer (SIM-6).

The obtained graft copolymer had a mass-average particle diameter of 94 nm. The latex was dried at 170° C. for 30 min and the solid content was determined to be 29.7%.

Comparative Example 2

Manufacture of a graft copolymer (SIM-7)

A composite rubber latex was obtained as in Example 1; and after the liquid temperature decreased to 75° C., a mixed liquid of 0.125 parts of t-butyl hydroperoxide, 18.8 parts of styrene and 6.2 parts of acrylonitrile was dropped onto the composite rubber latex in 50 min, and kept at 75° C. for 1 hour to complete the graft polymerization to the composite rubber. The spraying and drying was carried out as in Example 1 to obtain a powder of a graft copolymer (SIM-7).

The obtained graft copolymer had a mass-average particle diameter of 91 nm. The latex was dried at 170° C. for 30 min and the solid content was determined to be 29.9%.

Comparative Example 3

Manufacture of a Graft Copolymer (SIM-8)

A composite rubber latex was obtained as in Example 1; and after the liquid temperature decreased to 75° C., a mixed liquid of 0.125 parts of t-butyl hydroperoxide, 12.5 parts of methyl methacrylate, 9.4 parts of styrene and 3.1 parts of acrylonitrile was dropped onto the composite rubber latex in 45 min, and kept at 75° C. for 1 hour to complete the graft polymerization to the composite rubber. The spraying and drying was carried out as in Example 1 to obtain a powder of a graft copolymer (SIM-8).

The obtained graft copolymer had a mass-average particle diameter of 98 nm. The latex was dried at 170° C. for 30 min and the solid content was determined to be 29.5%.

Comparative Example 4

Manufacture of a Graft Copolymer (SIM-9)

10.7 parts of the polyorganosiloxane latex (SLx-2) was charged in a separable flask equipped with a thermometer, a nitrogen-introducing tube, a cooling tube and a stirrer. 149.1 parts of deionized water was added thereto, and thereafter a mixed liquid of 0.7 parts of dipotassium alkenylsuccinate, 45.7 parts of n-butyl acrylate, 2.3 parts of allyl methacrylate and 0.11 parts of t-butyl hydroperoxide was charged thereto, and stirred for 30 min to be impregnated in the polyorganosiloxane particles.

A nitrogen gas flow was introduced in the separable flask to replace the flask atmosphere by nitrogen, and the liquid temperature was raised to 60° C. At the time when the liquid temperature reached 60° C., an aqueous solution in which 0.000075 parts of ferrous sulfate, 0.000225 parts of disodium ethylenediaminetetraacetate and 0.2 parts of Rongalit were dissolved in 10 parts of deionized water was added thereto to initiate the radical polymerization. The liquid temperature rose to 78° C. due to the polymerization of the n-butyl acrylate mixed liquid. This state was kept for 1 hour to complete the polymerization of n-butyl acrylate to obtain a composite rubber latex. The obtained composite rubber had a mass-average particle diameter of 150 nm.

After the liquid temperature decreased to 70° C., an aqueous solution composed of 0.25 parts of Rongalit and 10 parts of deionized water was added to the composite rubber latex; and a mixed liquid of 0.05 parts of t-butyl hydroperoxide, 0.6 parts of n-butyl acrylate, 7 parts of styrene and 2.4 parts of acrylonitrile was dropped thereto in 120 min, and this state was kept for 1 hour.

Thereafter, an aqueous solution composed of 0.001 parts of ferrous sulfate, 0.003 parts of disodium ethylenediaminetetraacetate, 0.2 parts of Rongalit, 0.2 parts of dipotassium alkenylsuccinate and 10 parts of deionized water were added thereto; and a mixed liquid of 0.2 parts of t-butyl hydroperoxide, 2.4 parts of n-butyl acrylate, 28.2 parts of styrene and 9.4 parts of acrylonitrile was dropped thereto in 120 min, and kept at 60° C. for 30 min to complete the graft polymerization to the composite rubber. The spraying and drying was carried out as in Example 1 to obtain a powder of a graft copolymer (SIM-9).

The obtained graft copolymer had a mass-average particle diameter of 170 nm. The latex was dried at 170° C. for 30 min and the solid content was determined to be 34.7%.

Comparative Example 5

Manufacture of a Graft Copolymer (SIM-10)

42.8 parts of the polyorganosiloxane latex (SLx-2) was charged in a separable flask equipped with a thermometer, a nitrogen-introducing tube, a cooling tube and a stirrer. 150.9 parts of deionized water was added thereto, and thereafter a mixed liquid of 0.2 parts of sodium polyoxyethylene alkylphenyl ether sulfate, 41.6 parts of n-butyl acrylate, 0.3 parts of allyl methacrylate, 0.1 parts of 1,3-butylene glycol dimethacrylate and 0.11 parts of t-butyl hydroperoxide was charged thereto, and stirred for 30 min to be impregnated in the polyorganosiloxane particles.

A nitrogen gas flow was introduced in the separable flask to replace the flask atmosphere by nitrogen, and the liquid temperature was raised to 60° C. At the time when the liquid temperature reached 60° C., an aqueous solution in which 0.000075 parts of ferrous sulfate, 0.000225 parts of disodium ethylenediaminetetraacetate and 0.2 parts of Rongalit were dissolved in 10 parts of deionized water was added thereto to initiate the radical polymerization. The liquid temperature rose to 78° C. due to the polymerization of the n-butyl acrylate mixed liquid. This state was kept for 1 hour to complete the polymerization of n-butyl acrylate to obtain a composite rubber latex. The obtained composite rubber had a mass-average particle diameter of 150 nm.

After the liquid temperature decreased to 70° C., an aqueous solution composed of 0.25 parts of Rongalit and 10 parts of deionized water was added to the composite rubber latex; and a mixed liquid of 0.1 parts of t-butyl hydroperoxide, 15 parts of styrene and 5 parts of acrylonitrile was dropped thereto in 120 min, and this state was kept for 1 hour.

Thereafter, an aqueous solution composed of 0.001 parts of ferrous sulfate, 0.003 parts of disodium ethylenediaminetetraacetate, 0.2 parts of Rongalit, 0.2 parts of sodium polyoxyethylene alkylphenyl ether sulfate and 10 parts of deionized water was added thereto; and a mixed liquid of 0.15 parts of t-butyl hydroperoxide, 1.5 parts of methyl acrylate and 28.5 parts of methyl methacrylate was dropped thereto in 120 min, and kept at 60° C. for 30 min to complete the graft polymerization to the composite rubber. The spraying and drying was carried out as in Example 1 to obtain a powder of a graft copolymer (SIM-10).

The obtained graft copolymer had a mass-average particle diameter of 170 nm. The latex was dried at 170° C. for 30 min and the solid content was determined to be 32.8%.

The polymerization methods of, the mass-average particle diameters of, and the use amounts of the composite rubbers in, the obtained graft copolymers (SIM-1) to (SIM-10) are shown in Table 1.

TABLE 1

| | Graft Copolymer | Polyorgano-siloxane Latex | Use Amount of Composite Rubber [parts] | Use Amount of Vinyl Monomer [parts] In [ ], Use Amount of Initiator [parts] | | Mass-Average Particle Diameter [nm] |
|---|---|---|---|---|---|---|
| | | | | Graft Polymerization of the First Step | Graft Polymerization of the Second Step | |
| Example 1 | SIM-1 | SLx-1 | 75 | (b-1) MMA: 12.5 [0.0625] | (b-2) + (b-3) St: 9.4 AN: 3.1 [0.0625] | 92 |
| Example 2 | SIM-2 | SLx-1 | 50 | (b-1) MMA: 25 [0.125] | (b-2) + (b-3) St: 18.8 AN: 6.2 [0.125] | 89 |
| Example 3 | SIM-3 | SLx-1 | 75 | (b-1) MMA: 12.5 [0.03125] | (b-2) + (b-3) St: 9.4 AN: 3.1 [0.03125] | 95 |
| Example 4 | SIM-4 | SLx-1 | 75 | (b-1) MMA: 12.5 [0.1875] | (b-2) + (b-3) St: 9.4 AN: 3.1 [0.1875] | 93 |
| Example 5 | SIM-5 | SLx-2 | 75 | (b-1) MMA: 12.5 [0.0625] | (b-2) + (b-3) St: 9.4 AN: 3.1 [0.0625] | 123 |
| Comparative Example 1 | SIM-6 | SLx-1 | 75 | (b-1) MMA: 25 [0.125] | — | 94 |
| Comparative Example 2 | SIM-7 | SLx-1 | 75 | (b-2) + (b-3) St: 18.8 AN: 6.2 [0.125] | — | 91 |

TABLE 1-continued

| | Graft Copolymer | Polyorgano-siloxane Latex | Use Amount of Composite Rubber [parts] | Use Amount of Vinyl Monomer [parts] In [ ], Use Amount of Initiator [parts] | | Mass-Average Particle Diameter [nm] |
|---|---|---|---|---|---|---|
| | | | | Graft Polymerization of the First Step | Graft Polymerization of the Second Step | |
| Comparative Example 3 | SIM-8 | SLx-1 | 75 | (b-1) + (b-2) + (b-3)<br>MMA: 12.5<br>St: 9.4<br>AN: 3.1<br>[0.125] | — | 98 |
| Comparative Example 4 | SIM-9 | SLx-2 | 50 | BA + (b-2) + (b-3)<br>BA: 0.6<br>St: 7.0<br>AN: 2.4<br>[0.05] | BA + (b-2) + (b-3)<br>BA: 2.4<br>St: 28.2<br>AN: 9.4<br>[0.2] | 170 |
| Comparative Example 5 | SIM-10 | SLx-2 | 50 | (b-2) + (b-3)<br>St: 15.0<br>AN: 5.0<br>[0.1] | (b-1)<br>MMA: 28.5<br>MA: 1.5<br>[0.15] | 170 |

Initiator: t-butyl hydroperoxide
MMA: methyl methacrylate
St: styrene
AN: acrylonitrile
BA: n-butyl acrylate
MA: methyl acrylate Examples 6 to 12, and Comparative Examples 6 to 10

Each of the graft copolymers (SIM-1) to (SIM-10) and an AS resin (Sanrex SAN-C, made by Techno Polymer Co., Ltd.) were formulated in a ratio shown in Table 2 and charged and mixed for 3 min in a Henschel mixer. Thereafter, the mixture was melted and kneaded at a processing temperature of 240° C. using a twin-screw extruder (BT-40, made by Research Laboratory of Plastics Technology Co., Ltd.) to obtain a resin pellet.

A sample was prepared using the obtained resin pellet as described below and the hot plate weldability and the direct vapor deposition performance were evaluated. The results are shown in Table 2.

Hot Plate Weldability

The resin pellet was charged in a molding machine (IS-25EP, made by Toshiba Machine Co., Ltd.), melted at a temperature of 220 to 250° C., and molded into test pieces for hot plate welding of 60 mm in length, 30 mm in width and 3 mm in thickness. The condition of the test piece was adjusted at a temperature of 23° C. and a relative humidity of 50% for 3 hours; thereafter, the test piece was pressed on a hot plate under the conditions described below by a hot plate welder (hot plate test piece welding tester, made by Ida Seisakusho Y.K.); and the number of strings when the test piece was separated from the hot plate was counted. This test was repeated three times, and the average value of the number of strings was determined and evaluated as "the hot plate weldability" under the criterion described below.

The conditions of hot plate welding

Surface treatment of a hot plate: coated with Teflon

Temperature of the hot plate: 280° C.

Moving speed of a servo motor: 200 mm/sec

Time for which a test piece was brought into contact with the hot plate: 15 sec

Melted volume of the test piece: 0.5 mm

The criterion for judging

○: The number of strings was 3 or less.

x: The number of strings exceeded 3.

Direct Vapor Deposition Performance

The resin pellet was charged in a molding machine (IS-170FA, made by Toshiba Machine Co., Ltd.), melted at a temperature of 220 to 260° C., and filled in a die having a #8000-equivalent surface polishing, and molded into test pieces for direct vapor deposition of 120 mm in length, 120 mm in width and 2 mm in thickness. In order to evaluate the molding rate dependency, some of the test pieces was molded at a high injection-rate (50 mm/sec) and some thereof was molded at a low injection-rate (20 mm/sec).

The sputtering was carried out on a surface of the test piece for direct vapor deposition under the conditions described below by a vacuum film deposition apparatus (VRSP350MD, made by ShinMaywa Industries, Ltd.) to form an aluminum-deposited film. A plasma-polymerized film of HMDS (1,1,1,3,3,3-hexamethyldisilazane) was formed on a surface of the aluminum-deposited film under the conditions described below.

The sputtering conditions

The pressure after the finish of fore pumping: 5.0 Pa

The pressure after the finish of the regular pumping: $5.0 \times 10^{-3}$ Pa

The introduced gas: Argon gas at 100 SCCM (Standard cc/min)

The vacuum degree at film deposition: 0.7 Pa

The aluminum film thickness: 120 nm

The plasma polymerization conditions

The introduced gas: HMDS at 30 SCCM (Standard cc/mm)

The vacuum degree at polymerization: 1.5 Pa

A surface of the test piece on which a plasma-polymerized film had been formed was irradiated with light using a digital reflectiometer (TR-1100AD, made by Tokyo Denshoku Co., Ltd.) to measure a diffusion reflectance.

The diffusion reflectance (X) of the test piece molded at a low injection-rate and the diffusion reflectance (Y) of the test piece molded at a high injection-rate were measured to determine a ratio of the diffusion reflectances (X/Y). The ratio (X/Y) is a value becoming an index of the molding rate dependency.

A lower ratio (X/Y) indicates a lower dependency on the molding rate. A smaller value of the diffusion reflectance (Y) and a smaller ratio (X/Y) can provide a uniform appearance of molded products even for the molded products having a large size and a complicate shape, which indicates suitability for the direct vapor deposition.

The value of the diffusion reflectance (Y) is preferably 4.0% or lower, and more preferably 3.5% or lower.

The ratio (X/Y) is preferably 2.5 or lower, more preferably 2.0 or lower, and especially preferably 1.5 or lower.

The evaluation of the direct vapor deposition performance of the test piece was carried out under the following criterion for judging. The results are shown in Table 2.

The criterion for judging

◯: The diffusion reflectance (Y) was 4.0% or lower, and the ratio (X/Y) was 2.5 or lower.

x: The diffusion reflectance (Y) exceeded 4.0%, or the ratio (X/Y) exceeded 2.5.

test piece molded at a low injection-rate had a high diffusion reflectance (X) and a high ratio (X/Y) of the diffusion reflectances. Hence, it is clear that the molded product of Comparative Example 6 had a high molding rate dependency, and was inferior in the direct vapor deposition performance.

In the molded product of Comparative Example 7 in which the graft copolymer (SIM-7) of Comparative Example 2, obtained by polymerizing only styrene and acrylonitrile to the composite rubber, was formulated, the molded product was inferior in the hot plate weldability.

In the molded product of Comparative Example 8 in which the graft copolymer (SIM-8) of Comparative Example 3, obtained by adding and polymerizing methyl methacrylate, styrene and acrylonitrile, not in two steps but in batch, to the composite rubber, was formulated, the test piece molded at a

TABLE 2

|  |  | Example 6 | Example 7 | Example 8 | Example 9 | Example 10 | Example 11 | Example 12 |
|---|---|---|---|---|---|---|---|---|
| AS Resin [parts] | | 80 | 66.7 | 47 | 50 | 66.7 | 66.7 | 66.7 |
| Graft Copolymer [parts] | SIM-1 | 20 | 33.3 | 53 | — | — | — | — |
| | SIM-2 | — | — | — | 50 | — | — | — |
| | SIM-3 | — | — | — | — | 33.3 | — | — |
| | SIM-4 | — | — | — | — | — | 33.3 | — |
| | SIM-5 | — | — | — | — | — | — | 33.3 |
| | SIM-6 | — | — | — | — | — | — | — |
| | SIM-7 | — | — | — | — | — | — | — |
| | SIM-8 | — | — | — | — | — | — | — |
| | SIM-9 | — | — | — | — | — | — | — |
| | SIM-10 | — | — | — | — | — | — | — |
| Content of Composite Rubber [%] | | 15 | 25 | 40 | 25 | 25 | 25 | 25 |
| Hot Plate Weldability | | ◯ | ◯ | ◯ | ◯ | ◯ | ◯ | ◯ |
| Direct Vapor Deposition Performance | Diffusion Reflectance (X) of a Low-Rate Molded Product [%] | 3.2 | 3.8 | 4.8 | 4.0 | 3.5 | 3.1 | 4.4 |
| | Diffusion Reflectance (Y) of a High-Rate Molded Product [%] | 2.7 | 2.9 | 3.4 | 3.1 | 2.9 | 2.7 | 3.4 |
| | Ratio (X/Y) of Molding-Rate Dependency | 1.2 | 1.3 | 1.4 | 1.3 | 1.2 | 1.1 | 1.3 |
| | Judgement | ◯ | ◯ | ◯ | ◯ | ◯ | ◯ | ◯ |

|  |  | Comparative Example 6 | Comparative Example 7 | Comparative Example 8 | Comparative Example 9 | Comparative Example 10 |
|---|---|---|---|---|---|---|
| AS Resin [parts] | | 66.7 | 66.7 | 66.7 | 66.7 | 60 |
| Graft Copolymer [parts] | SIM-1 | — | — | — | — | — |
| | SIM-2 | — | — | — | — | — |
| | SIM-3 | — | — | — | — | — |
| | SIM-4 | — | — | — | — | — |
| | SIM-5 | — | — | — | — | — |
| | SIM-6 | 33.3 | — | — | — | — |
| | SIM-7 | — | 33.3 | — | — | — |
| | SIM-8 | — | — | 33.3 | — | — |
| | SIM-9 | — | — | — | 50 | — |
| | SIM-10 | — | — | — | — | 50 |
| Content of Composite Rubber [%] | | 25 | 25 | 25 | 25 | 25 |
| Hot Plate Weldability | | ◯ | x | ◯ | x | ◯ |
| Direct Vapor Deposition Performance | Diffusion Reflectance (X) of a Low-Rate Molded Product [%] | 15.7 | 4.2 | 12.5 | 4.2 | 15.4 |
| | Diffusion Reflectance (Y) of a High-Rate Molded Product [%] | 2.9 | 3.2 | 3.2 | 3.2 | 3.5 |
| | Ratio (X/Y) of Molding-Rate Dependency | 5.4 | 1.3 | 3.9 | 1.3 | 4.4 |
| | Judgement | x | ◯ | x | ◯ | x |

In Table 2, the content of a composite rubber indicates a content of the composite rubber with respect to a thermoplastic resin composition (AS resin+a graft copolymer).

As is clear from the results, the molded products of Examples 6 to 12 in which the graft copolymers of Examples 1 to 5 were formulated had excellent hot plate weldability and direct vapor deposition performance.

By contrast, in the molded product of Comparative Example 6 in which the graft copolymer (SIM-6) of Comparative Example 1, obtained by polymerizing only methyl methacrylate to the composite rubber, was formulated, the low injection-rate had a high diffusion reflectance (X) and a high ratio (X/Y) of the diffusion reflectances. Hence, it is clear that the molded product of Comparative Example 8 had a high molding rate dependency, and was inferior in the direct vapor deposition performance.

In the molded product of Comparative Example 9 in which the graft copolymer (SIM-9) of Comparative Example 4, obtained by polymerizing n-butyl acrylate (an alkyl (meth) acrylate monomer whose homopolymer had a Tg of not more than 0° C.), styrene and acrylonitrile in two steps to the composite rubber, was formulated, the molded product was inferior in the hot plate weldability.

In the molded product of Comparative Example 10 in which the graft copolymer (SIM-10) of Comparative Example 5, obtained by polymerizing styrene and acrylonitrile to the composite rubber, and thereafter polymerizing methyl methacrylate and methyl acrylate thereto, was formulated, the test piece molded at a low injection-rate had a high diffusion reflectance (X) and a high ratio (X/Y) of the diffusion reflectances. Hence, it is clear that the molded product of Comparative Example 10 had a high molding rate dependency, and was inferior in the direct vapor deposition performance.

The invention claimed is:

1. A graft copolymer (B), prepared by polymerizing a (meth)acrylate monomer (b1), a homopolymer of which has a glass transition temperature exceeding 0° C., in the presence of a composite rubber (A) containing a polyorganosiloxane (A1) and a poly(meth)acrylate (A2), and then polymerizing an aromatic vinyl monomer (b2) and a cyanided vinyl monomer (b3).

2. A thermoplastic resin composition, containing 1 to 99% by mass of a graft copolymer (B) according to claim 1 and 99 to 1% by mass of a thermoplastic resin (C).

3. The thermoplastic resin composition according to claim 2, wherein the thermoplastic resin composition comprises a molded product on a surface of which a vapor deposition layer is formed by direct vapor deposition.

4. The thermoplastic resin composition according to claim 2, wherein the thermoplastic resin composition comprises a molded product to be used in a hot plate welding method.

5. A molded product comprising a thermoplastic resin composition according to claim 2.

6. A molded product comprising a thermoplastic resin composition according to claim 3.

7. A molded product comprising a thermoplastic resin composition according to claim 4.

8. An automotive lamp, obtained by joining a molded product according to claim 5 and a lens member by a hot plate welding method.

9. An automotive lamp, obtained by joining a molded product according to claim 6 and a lens member by a hot plate welding method.

10. An automotive lamp, obtained by joining a molded product according to claim 7 and a lens member by a hot plate welding method.

11. The graft copolymer according to claim 1, wherein the (meth)acrylate monomer (b1) is an alkyl methacrylate.

12. The graft copolymer according to claim 1, wherein the polyorganosiloxane (A1) is a cyclic organosiloxane which is linked through a graft crossing agent.

13. The graft copolymer according to claim 1, wherein the aromatic vinyl monomer (b2) is styrene, α-methylstyrene or vinyltoluene.

14. The graft copolymer according to claim 1, wherein the cyanided vinyl monomer (b3) is acrylonitrile or methacrylonitrile.

15. The thermoplastic resin composition according to claim 2, wherein the thermoplastic resin (C) comprises at least one member selected from the group consisting of polymethyl methacrylates, polycarbonate resins, polybutylene terephthalates, polyethylene terephthalates, polyethylene naphthalates, polyvinyl chlorides, polystyrenes, modified polyphenylene ethers, polyamides, acrylonitrile-styrene copolymers, acrylonitrile-α-methylstyrene copolymers, styrene-maleic anhydride copolymers, methyl methacrylate-styrene copolymers, acrylonitrile-styrene-N-substituted maleimide ternary copolymers, styrene-maleic anhydride-N-substituted maleimide ternary copolymers and acrylonitrile-styrene-methyl methacrylate copolymers.

16. A method of making the graft copolymer (B) according to claim 1, comprising:
 (1) polymerizing a (meth)acrylate monomer (b1), a homopolymer of which has a glass transition temperature exceeding 0° C., in the presence of a composite rubber (A) containing a polyorganosiloxane (A1) and a poly(meth)acrylate (A2), and then
 (2) polymerizing an aromatic vinyl monomer (b2) and a cyanided vinyl monomer (b3).

* * * * *